(12) United States Patent
Cases et al.

(10) Patent No.: US 7,739,562 B2
(45) Date of Patent: Jun. 15, 2010

(54) PROGRAMMABLE DIAGNOSTIC MEMORY MODULE

(75) Inventors: Moises Cases, Austin, TX (US); Daniel Mark Dreps, Georgetown, TX (US); Bhyrav M. Mutnury, Austin, TX (US); Nam H. Pham, Round Rock, TX (US); Daniel N. De Araujo, Cedar Park, TX (US)

(73) Assignee: International Business Machines Corporation, Armonk, NY (US)

( * ) Notice: Subject to any disclaimer, the term of this patent is extended or adjusted under 35 U.S.C. 154(b) by 444 days.

(21) Appl. No.: 11/840,481

(22) Filed: Aug. 17, 2007

(65) Prior Publication Data

US 2009/0049339 A1   Feb. 19, 2009

(51) Int. Cl.
  *G01C 29/00* (2006.01)
(52) U.S. Cl. .......................... 714/718; 714/30
(58) Field of Classification Search ............ 710/8; 701/35, 209; 711/105; 714/42, 31, 718, 714/30

See application file for complete search history.

(56) References Cited

U.S. PATENT DOCUMENTS

| | | | |
|---|---|---|---|
| 4,354,268 A | 10/1982 | Michel et al. | |
| 6,467,053 B1 | 10/2002 | Connolly et al. | |
| 6,832,141 B2 * | 12/2004 | Skeen et al. | 701/35 |
| 7,184,915 B2 | 2/2007 | Hansquine et al. | |
| 7,206,979 B1 | 4/2007 | Zarrineh et al. | |
| 7,231,562 B2 | 6/2007 | Ohihoff et al. | |
| 7,246,278 B2 | 7/2007 | Stocken et al. | |
| 7,250,784 B2 | 7/2007 | Azimi et al. | |
| 7,353,328 B2 * | 4/2008 | MacLaren et al. | 711/105 |
| 7,356,737 B2 * | 4/2008 | Cowell et al. | 714/42 |
| 7,392,442 B2 | 6/2008 | Averbuj et al. | |
| 7,395,476 B2 | 7/2008 | Cowell et al. | |
| 7,415,649 B2 | 8/2008 | Bucksch | |
| 7,480,830 B2 * | 1/2009 | Cowell et al. | 714/42 |

(Continued)

OTHER PUBLICATIONS

Office Action in U.S. Appl. No. 11/840,498 of Jul. 10, 2009.

(Continued)

*Primary Examiner*—David Ton
(74) *Attorney, Agent, or Firm*—Mitch Harris, Atty at Law, LLC; Andrew M. Harris; Diana R. Gerhardt

(57) ABSTRACT

A programmable diagnostic memory module provides enhanced testability of memory controller and memory subsystem design. The programmable diagnostic memory module includes an interface for communicating with an external diagnostic system, and the interface is used to transfer commands to the memory module to alter various behaviors of the memory module. The altered behaviors may be changing data streams that are written to the memory module to simulate errors, altering the timing and/or loading of the memory module signals, downloading programs for execution by a processor core within the memory module, changing driver strengths of output signals of the memory module, and manipulating in an analog domain, signals at terminals of the memory module such as injecting noise on power supply connections to the memory module. The memory module may emulate multiple selectable memory module types, and may include a complete storage array to provide standard memory module operation.

26 Claims, 4 Drawing Sheets

U.S. PATENT DOCUMENTS

| | | |
|---|---|---|
| 7,487,413 B2 | 2/2009 | Lee et al. |
| 7,516,363 B2 * | 4/2009 | Jeddeloh ............... 714/31 |
| 2004/0243731 A1 * | 12/2004 | Vu ............... 710/8 |
| 2005/0096809 A1 * | 5/2005 | Skeen et al. ............ 701/29 |
| 2005/0138506 A1 | 6/2005 | Stocken et al. |
| 2008/0082221 A1 * | 4/2008 | Nagy ............... 701/2 |

OTHER PUBLICATIONS

Data Sheet for Netlist DLS2 DRAM Load Simulator for DDR2 SDRAMS, 2006, Netlist, Inc. Irvine, CA.

* cited by examiner

PROGRAMMABLE DIAGNOSTIC MEMORY MODULE

CROSS-REFERENCE TO RELATED PATENT APPLICATION

The present application is related to co-pending U.S. patent application Ser. No. 11/840,498, filed Aug. 17, 2007, entitled "METHOD FOR PERFORMING MEMORY DIAGNOSTICS USING A PROGRAMMABLE DIAGNOSTIC MEMORY MODULE", filed concurrently herewith by the same Inventors and assigned to the same Assignee. The above-referenced U.S. patent application is incorporated herein by reference.

BACKGROUND OF THE INVENTION

1. Technical Field

The present invention relates generally to processing system memory subsystems, and more particularly, to a diagnostic memory module that provides programmable functionality to observe and/or alter memory module behavior.

2. Description of the Related Art

Memory subsystems in present-day computer systems include multiple memory modules that provide system memory. During design and manufacture of such computer systems and their elements such as processor blade units or motherboards, and in particular, dedicated memory controller units and processors incorporating a memory controller unit, it is desirable to evaluate features such as error detection and error correction, as well as design margins for memory performance such as read cycle delay and write cycle timing margins.

However, performance of an actual memory device is typically fixed by design and therefore techniques for testing the error detection/correction mechanisms have traditionally been limited to methods such as using "known bad" modules, or techniques such as forcing parity errors by disabling parity information. Software has long been available for performing system memory tests, but such tests are performed on memory implementations that are fixed by design, or are externally manipulated in a laboratory environment. Timing margins have been evaluated by changing external loads or terminators, but such techniques are time-consuming and provide only a crude evaluation of the actual timing margins. Furthermore, such methodologies do not reveal information describing behavior internal to a memory module, but only the behavior of the memory module when influenced by external loading.

Load devices that can be directly inserted in a standardized memory module socket have provided some simplification of memory controller and system design evaluation, in that test points can be provided while still providing a nominal load equivalent to an actual memory device. However, such test modules typically have fixed signal loading values and replace a memory device with only passive loads and test points, in which the passive loads approximate the loading of an actual memory module. In order to change the loading, the inserted load device would have to be removed and another load device with different loading characteristics would have to be inserted. The test points provided are also not located at the exact location of storage that can be written to and read from, and therefore only provide for measurement of external memory bus signals. Further, testing error detection/correction mechanisms using such a device is still limited to techniques such as externally loading a test point until a fault occurs.

It is therefore desirable to provide a method and apparatus for evaluating memory controller and memory subsystem designs that provide flexible manipulation of the memory subsystem behavior and information about signal behavior at the actual location of the storage. It would further be desirable to provide information about signal behavior internal to a memory module.

SUMMARY OF THE INVENTION

The objective of providing flexible manipulation of memory subsystem behavior and information about signal behavior at the actual location of the storage, including signal behavior internal to the memory module, is provided in a diagnostic memory module and test method.

The diagnostic memory module includes memory module interface terminals for connecting the diagnostic memory module to a memory subsystem in place of an ordinary memory module and an interface for communicating between the diagnostic memory module and an external diagnostic system.

The diagnostic memory module may include programmable elements for altering the behavior of the memory module signals, such as output drivers with programmable drive strength, programmable loading circuits for changing an electrical load at the memory module interface terminals. The diagnostic memory module may also include a processor core for executing program instructions to perform diagnostic operations and the program instructions may be downloaded to the processor core from the external diagnostic system. Alternatively, dedicated logic can be provided to perform diagnostic operations in response to commands received from the interface.

The processor core or dedicated logic may perform operations such as altering data streams written to the diagnostic memory module to simulate errors, alter the timing between address and data signals, and manipulating signals on terminals of the diagnostic memory module, for example power supply connections, in an analog domain, to inject noise. The diagnostic memory module may also include test points for providing access to signals of the diagnostic memory module by external test equipment.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DESCRIPTION OF ILLUSTRATIVE EMBODIMENT

The present invention concerns a diagnostic memory module for performing test and evaluation of memory sub-system designs. The memory module is packaged for insertion into a standard connector that accepts ordinary memory modules, according to the physical design of the system and the memory module types accepted by the system. In the illustrative embodiment, a dual inline memory module (DIMM) package is assumed in accordance with present-day popular packaging styles. However, it is understood that the diagnostic memory module of the present invention can be implemented in any style of packaging and for any memory device architecture. The diagnostic memory module of the present invention includes a programmable element, such as a processor core, for performing various operations within diagnostic memory module, such as varying the loading and timing relationships of the memory module interface signals, as well as altering the supposed contents of the memory module to affect errors. The diagnostic memory module may or may not contain a full storage array for implementing ordinary memory module functionality, and therefore the contents may be "supposed", as opposed to actually stored in an actual storage array. Instead, the contents of a write transfer may be stored in a buffer, altered and then returned in response to a write operation and therefore, the diagnostic memory module may or may not provide actual storage expected by software other than a test program for use with the diagnostic memory module.

The diagnostic memory module of the present invention may be type-programmable, so that a single implementation of an integrated circuit embodying the memory module may be selectably adapted to emulate, for example DDR and DDR2 DRAM modules, with the appropriate changes to the physical interconnect scheme. The selection may be made under program control, by downloading a diagnostic memory module program into a program storage within the memory module, or may be made by a hardwired selection mechanisms such as jumpers or switches. The memory module may be programmable via the download mechanism described above, or the diagnostic program may be permanently stored or stored in a non-volatile memory supporting re-programmability. The programmable element and diagnostic program may be a processor core and associated program instructions, a dedicated logic, or a programmable logic array and associated programming code.

Figure 1:
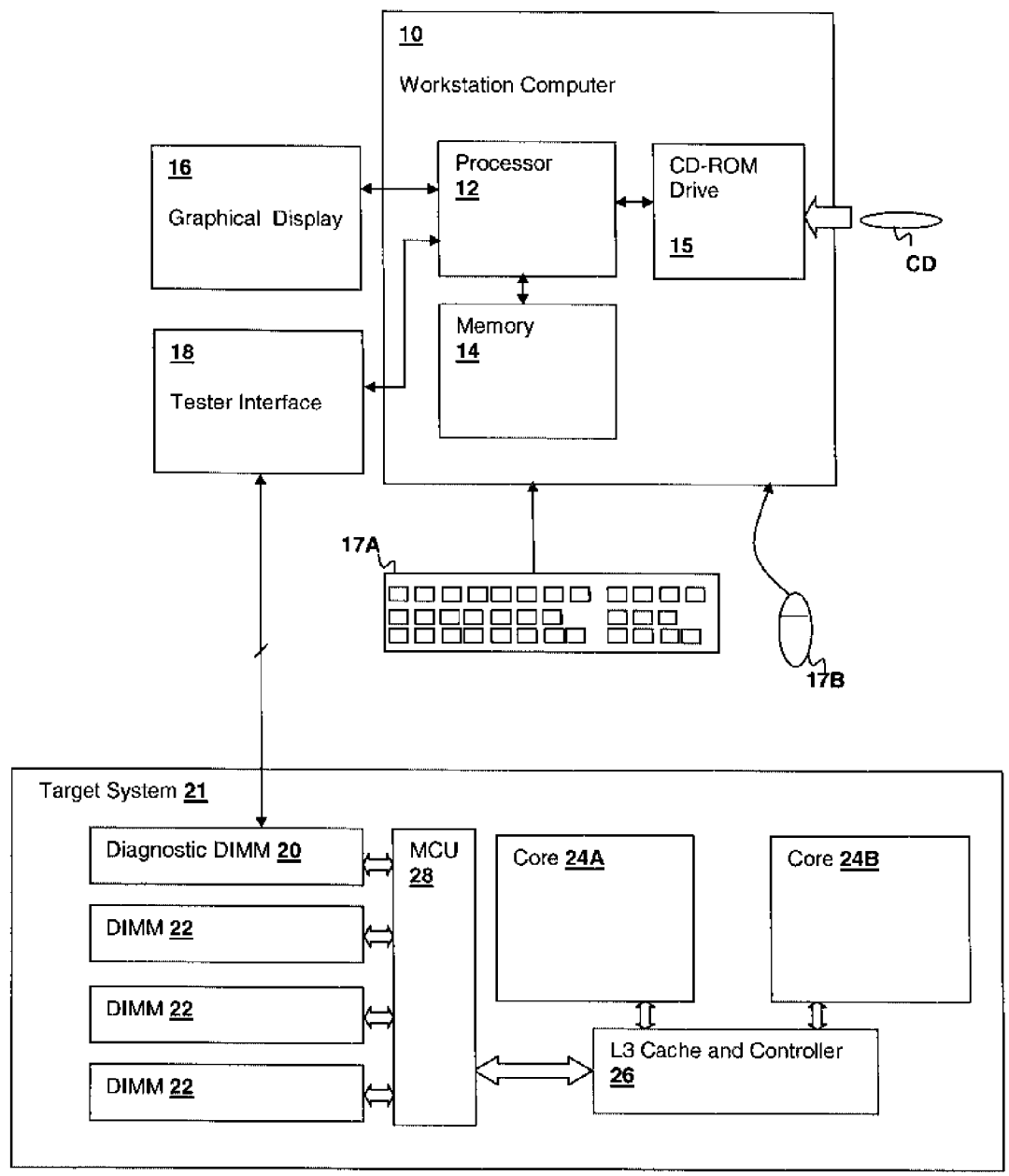
FIG. 1 is a block diagram of a computer system having a diagnostic memory module in accordance with an embodiment of the invention installed, coupled to a workstation test system.

Referring now to FIG. 1, a system in which the present invention can be practiced is illustrated. A workstation computer 10 may be a personal computer, general-purpose workstation, or dedicated test computer system. Workstation computer system 10 includes a graphical display 16 for providing visual information to a user and may be used to monitor operational values received from embodiments of the present invention, as well as controlling settings and downloading program code that perform the methods of the present invention, by communication with a diagnostic memory module 20 within a target computer system 21. A keyboard 17A and a pointing device 17B are attached to workstation computer 10 for receiving user input. Workstation computer 10 includes a processor 12 coupled to a memory 14 that contains program instructions for execution by processor 12 including program instructions in accordance with embodiments of the present invention for controlling and receiving information from target computer system 21. Computer program products in accordance with embodiments of the present invention include media such as compact disc CD that stores encoded program instructions that may be read by CD-ROM drive 15 and stored in memory 14 for execution by processor 12.

Target computer system 21 is illustrated in the form of a blade processor unit, as might be employed within a blade server system. Processor cores 24A and 24B are coupled to a level 3 cache unit 26 that is coupled to a memory controller unit (MCU) 28 that controls the transfer of program instructions and data between a memory subsystem and L3 cache unit 26. The memory subsystem includes four DIMM slots for system memory, which in the illustrated embodiment are populated with three ordinary DIMMS 22 and a diagnostic DIMM 20 in accordance with an embodiment of the present invention. A tester interface 18 of workstation computer system 10 is coupled to diagnostic DIMM 20 via an interface such as a Joint Test Action Group (JTAG) interface, dedicated serial interface, scan chain interface, or any other communications link suitable for transferring data and programs/PGA configuration data between diagnostic DIMM 20 and workstation computer system 10. The electrical connections between tester interface 18 may be via probes to the circuit board of diagnostic DIMM 20, via a cable to an additional connector on diagnostic DIMM 20, or via additional protocols added to a communications interface implemented in DIMM 20 via the ordinary DIMM connector as provided for DIMM power management and DIMM configuration information retrieval.

Figure 2:
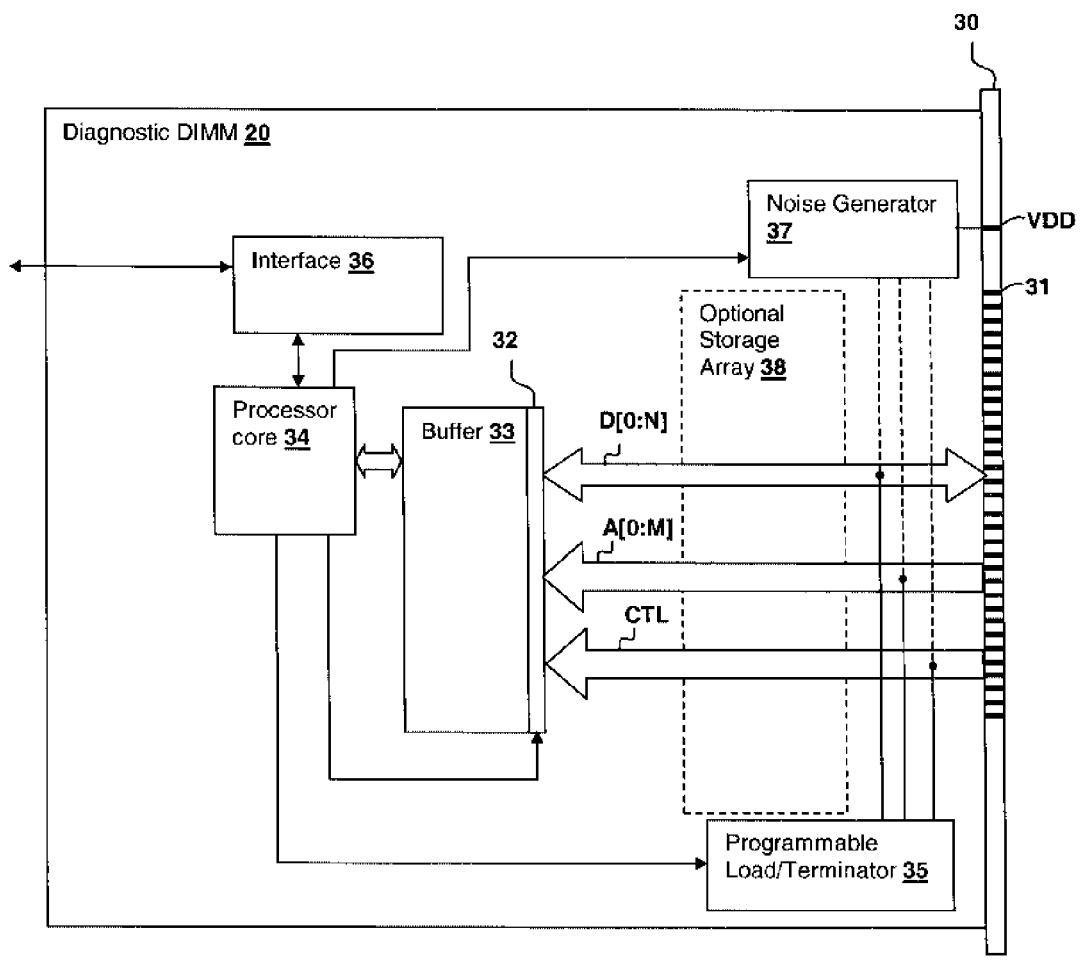
FIG. 2 is a block diagram of a diagnostic memory module in accordance with an embodiment of the invention.

Referring now to FIG. 2, a block diagram of diagnostic DIMM 20 is depicted in accordance with an embodiment of the present invention. An interface 36 provides the above described data and program link between workstation computer system 10 and a processor core 34 (or alternatively dedicated or programmable logic such as a PGA). Diagnostic DIMM 20 includes a connector 30 that connects to target system 20 via edge connector terminals 31 that provide connection for data signals D[0:N], address signals A[0:M] and control signals CTL. An optional storage array 38 provides for operation as an ordinary DIMM, and may be bypassed by processor core 34 for special diagnostic operations as will be described in further detail below. A buffer 33 is provided for simulating data read and data write operations that vary from the performance of operations performed to and from storage array 38. Processor core 34 can modify the contents of buffer 33 to simulate errors, and buffer 33 can also include ECC and/or parity bits so that either error indications or actual error conditions may be set after a write, so that a subsequent read operation yields the error condition. Error conditions such as total lane failure, single and multi-bit line failures and transient bit errors can be easily generated in any pattern. A programmable buffer/delay circuit 32 allows processor core 34 to set characteristics of the interface to and from buffer 33. The read output strength of buffer/delay circuit 32 can be set, along with a delay of address signals A[0:M], control signals CTL and/or data signals D[0:N], so that early/late timing relationships between the address, data and control signals can be explored to evaluate designs and operational systems to locate defects or borderline timing conditions and determine timing margins.

A programmable load/terminator circuit 35, provides for variation of bus loading, timing and voltage characteristics, by programmable adjustment of bus termination/loading characteristics of A[0:M], control signals CTL and/or data signals D[0:N] by processor core 34. A noise generator circuit 37, which may be an analog circuit such as an analog-todigital converter (ADC) coupled via a resistance to one or more of the signals on connector 30, or a digitally-switched circuit that affects signals on connector 30 in the analog domain, provides for simulation of noise effects in the memory subsystem, by injecting noise. For example, noise generator circuits 37 may inject noise on power supply connection VDD of connector 30, and the magnitude/character of the noise is varied to observe effects on performance of either diagnostic DIMM 20 or ordinary DIMMS 22 of FIG. 1.

Figure 3:
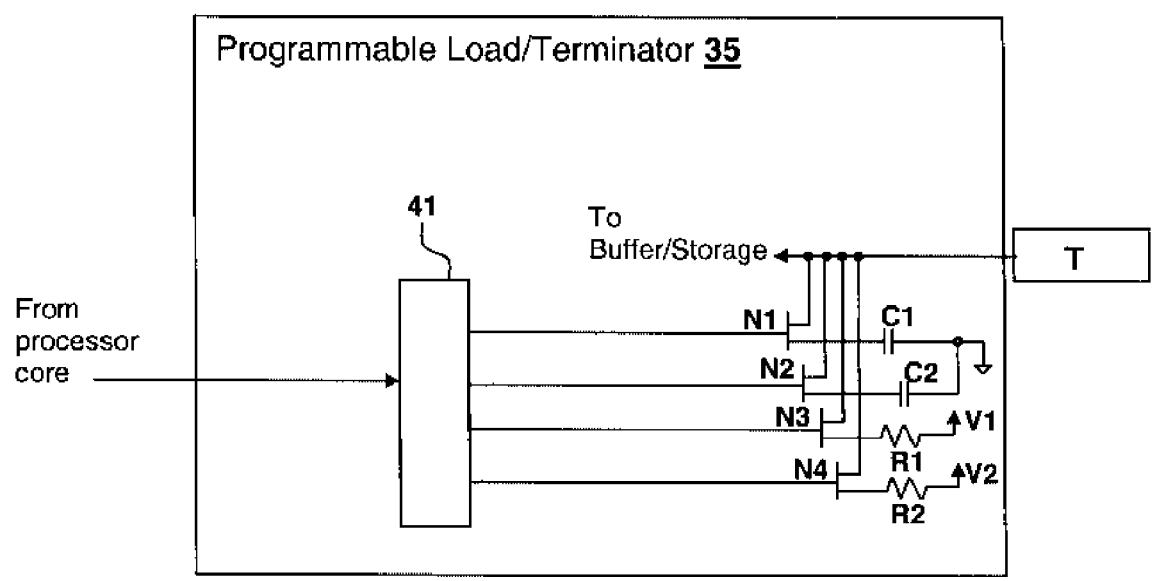
FIG. 3 is a schematic diagram depicting details of programmable load/terminator 35 of FIG. 2, in accordance with an embodiment of the invention.

Referring now to FIG. 3, details of programmable logic/terminator circuit 35 are shown in accordance with an embodiment of the invention. A register 41, receives a value from processor core 34 and controls a set of transistors N1-N4 that selectably couple any combination of termination resistors R1 and R2, which are connected to termination voltage sources V1 and V2, respectively to signals of connector 30 such as terminal T. Loading capacitors C1 and C2 are also selectably coupled to signals of connector 30 to vary the capacitive loading.

Figure 4:
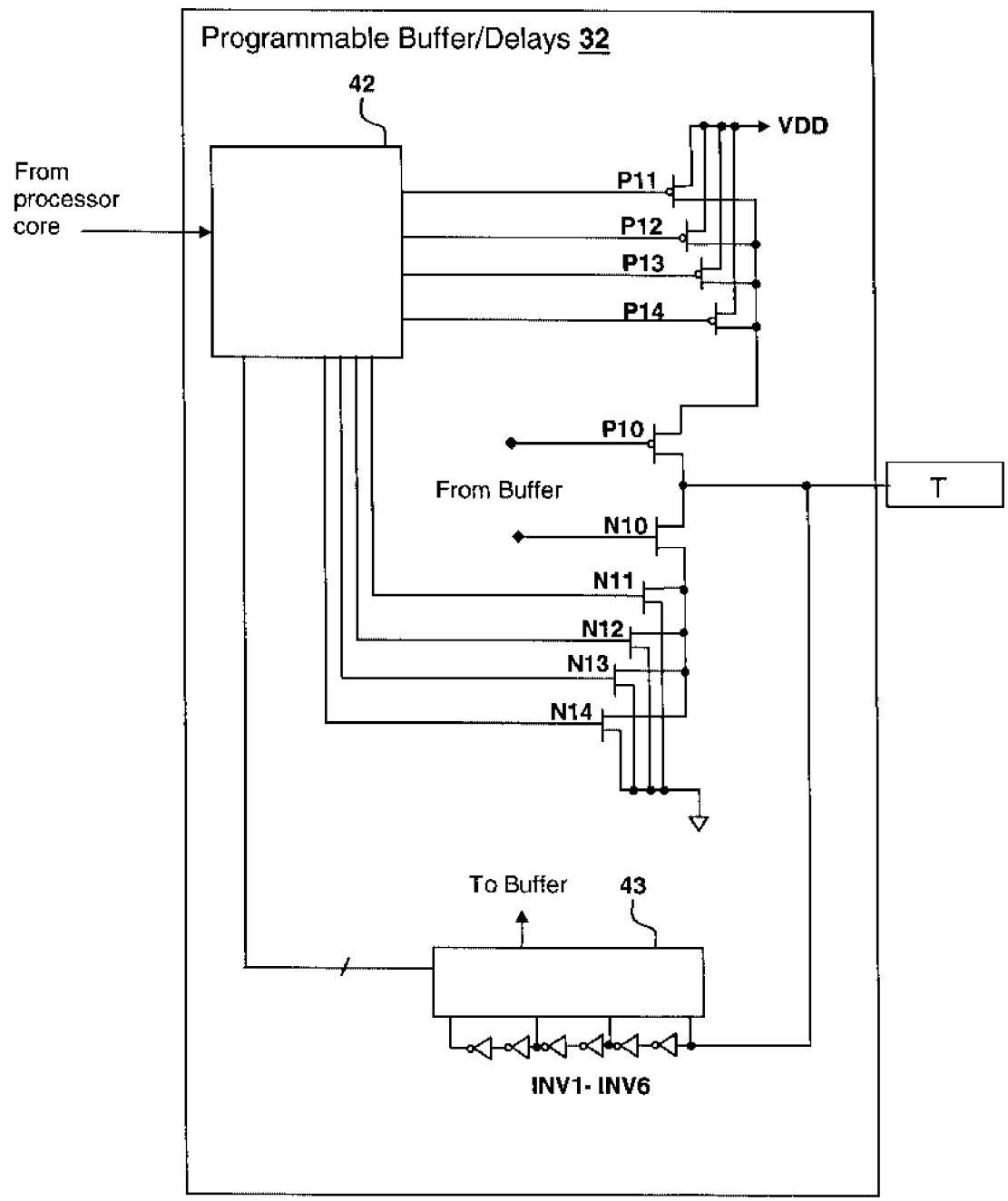
FIG. 4 is schematic diagram depicting details of programmable buffers/delays 32 of FIG. 2, in accordance with an embodiment of the invention.

Referring now to FIG. 4, details of programmable buffers/delay circuit 32 are shown in accordance with an embodiment of the invention. A register 42, receives a value for setting a drive strength of a tri-state inverter implemented by transistors N10 and P10, which is coupled to power supply rail VDD by transistors P11-P14 and to ground by transistor N11-N14. The gates of transistors P11-P14 and transistor N11-Nl4 are selectably enabled in combinations according to the values set in register 42, to change the source resistance of the tri-state inverter implemented by transistors N10 and P10, which changes the slew rate/delay time provided by the corresponding output signal to terminal T. Programmable buffers/delay circuit 32 also provides a programmable input delay for an input signal received at terminal T by selecting a tap from a delay chain formed by inverters I1-I6 using a multiplexer 43, having a selection controlled by bits provided from register 42.

The above-described embodiment provides, programmable bus line loading, delays and data manipulation that can simulate a wide range of operating and error conditions. Various programs may be downloaded to processor core 34 and used to execute test patterns that can verify and diagnose errors in memory subsystem designs. The above-described embodiment also provides the ability to generate noise on power supplies and/or bus lines to aggravate operating conditions to test the robustness of memory subsystem designs.

While the invention has been particularly shown and described with reference to the preferred embodiment thereof, it will be understood by those skilled in the art that the foregoing and other changes in form, and details may be made therein without departing from the spirit and scope of the invention.

What is claimed is:

1. A diagnostic memory module, comprising:
    memory module interface terminals for connecting the diagnostic memory module in place of an ordinary memory module in a memory subsystem;
    a storage for storing a diagnostic program;
    a processing unit for executing the diagnostic program; and
    an interface for communicating between the processing unit and an external diagnostic system.

2. The diagnostic memory module of claim 1, further comprising a plurality of memory devices for providing equivalent storage as would be otherwise provided by the ordinary memory module.

3. The diagnostic memory module of claim 1, wherein the interface transfers program instructions of the diagnostic program from the external diagnostic system.

4. The diagnostic memory module of claim 1, wherein the diagnostic program comprises program instructions for:
    storing a stream of data corresponding to memory write operations received at the memory module interface terminals;
    altering the stream of data to generate an altered stream for simulating an error condition; and
    responding to memory read operations received at the memory module interface terminals by providing the altered stream at the memory module interface terminals.

5. The diagnostic memory module of claim 1, further comprising a programmable loading circuit for altering an electrical load of one of more of the memory module interface terminals, whereby the behavior of the memory subsystem is altered.

6. The diagnostic memory module of claim 1, wherein the diagnostic memory module includes a circuit for manipulating a signal on at least one of the memory module interface terminals in an analog domain to simulate noise, wherein the interface receives a command to manipulate the signal, and wherein the circuit manipulates the signal in response to receiving the command.

7. The diagnostic memory module of claim 6, wherein the at least one memory module interface terminal is a power supply terminal.

8. The diagnostic memory module of claim 1, wherein an output driver of the diagnostic memory module has a programmable drive strength, wherein the interface receives a command to alter a drive strength of an output signal provided from the diagnostic memory module on at least one of the memory module interface terminals, and wherein the processing unit sets the programmable drive strength of the output driver in response to receiving the command.

9. The diagnostic memory module of claim 1, further comprising a timing offset circuit for adjusting a timing relationship between address signals and data signals within the diagnostic memory module, and wherein the interface receives a command to adjust the timing relationship between the address signals and the data signals, and wherein the processing unit programs the timing offset circuit to adjust the timing relationship in response to receiving the command.

10. The diagnostic memory module of claim 1, wherein the interface receives a command to emulate a particular module type of a plurality of memory module types, and wherein the processing unit sets the particular module type as an emulation type in response to receiving the command.

11. The diagnostic memory module of claim 1, further comprising at least one test point for probing signals within the diagnostic memory module.

12. A test workstation computer system, comprising a processor for executing workstation program instructions, a memory for storing the workstation program instructions, and an interface for communicating with a diagnostic memory module inserted in a target memory subsystem, wherein the workstation program instructions comprise program instructions for communicating with the diagnostic memory module to transfer diagnostic information between the diagnostic memory module and the test workstation computer system.

13. The test workstation computer system of claim 12, wherein the workstation program instructions for communicating transfer program instructions of a diagnostic program for execution by a diagnostic memory module processor core within the diagnostic memory module, from the test workstation computer system to the diagnostic memory module.

14. The test workstation computer system of claim 12, wherein the diagnostic program comprises program instructions for manipulating a stream of data written to the diagnostic memory module to produce an altered stream of data simulating an error condition, and providing the altered stream of data in response to a memory read operation received by the diagnostic memory module.

15. The test workstation computer system of claim 12, wherein the workstation program instructions for communicating communicate a command to program a programmable loading circuit for altering an electrical load of the diagnostic memory module in the target memory subsystem, whereby the behavior of the target memory subsystem is altered.

16. The test workstation computer system of claim 12, wherein the diagnostic memory module includes a circuit for manipulating signals within the target memory subsystem in an analog domain to simulate noise, wherein the workstation program instructions for communicating communicate a command to activate the circuit for manipulating signals, whereby the behavior of the target memory subsystem is altered.

17. The test workstation computer system of claim 12, wherein the diagnostic memory module includes an output driver having a programmable drive strength, wherein the workstation program instructions for communicating communicate a command to alter the drive strength.

18. The test workstation computer system of claim 12, wherein the diagnostic memory module further includes a timing offset circuit for adjusting a timing relationship between address signals and data signals within the diagnostic memory module, and wherein program instructions for communicating communicate a command to adjust the timing relationship between the address signals and the data signals.

19. A computer program product, comprising computer-readable storage media encoding workstation program instructions for execution by a test workstation computer system connected via an interface a diagnostic memory module inserted in a target memory subsystem, wherein the workstation program instructions comprise program instructions for communicating with a diagnostic memory module to transfer diagnostic information between the diagnostic memory module and the test workstation computer system.

20. The computer program product of claim 19, wherein the workstation program instructions for communicating transfer program instructions of a diagnostic program for execution by a diagnostic memory module processor core within the diagnostic memory module, from the test workstation computer system to the diagnostic memory module.

21. The computer program product of claim 20, wherein the diagnostic program comprises program instructions for manipulating a stream of data written to the diagnostic memory module to produce an altered stream of data simulating an error condition, and providing the altered stream of data in response to a memory read operation received by the diagnostic memory module.

22. The computer program product of claim 19, wherein the workstation program instructions for communicating communicate a command to program a programmable loading circuit for altering an electrical load of the diagnostic memory module in the target memory subsystem, whereby the behavior of the target memory subsystem is altered.

23. The computer program product of claim 19, wherein the diagnostic memory module includes a circuit for manipulating signals within the target memory subsystem in an analog domain to simulate noise, wherein the workstation program instructions for communicating communicate a command to activate the circuit for manipulating signals, whereby the behavior of the target memory subsystem is altered.

24. The computer program product of claim 19, wherein the diagnostic memory module includes an output driver having a programmable drive strength, wherein the workstation program instructions for communicating communicate a command to alter the drive strength.

25. The computer program product of claim 19, wherein the diagnostic memory module further includes a timing offset circuit for adjusting a timing relationship between address signals and data signals within the diagnostic memory module, and wherein program instructions for communicating communicate a command to adjust the timing relationship between the address signals and the data signals.

26. A programmable interactive diagnostic memory module, comprising:
   memory module interface terminals for connecting the diagnostic memory module in place of an ordinary memory module in a memory subsystem;
   a plurality of memory devices for providing equivalent storage as would be otherwise provided by the ordinary memory module;
   a storage for storing a diagnostic program, wherein the diagnostic program includes program instructions for storing a stream of data corresponding to memory write operations received at the memory module interface terminals, altering the stream of data to generate an altered stream for simulating an error condition, and
   responding to memory read operations received at the memory module interface terminals by providing the altered stream at the memory module interface terminals;
   a processing unit for executing the diagnostic program;
   an interface for communicating between the processing unit and an external diagnostic system, wherein the interface transfers program instructions of the diagnostic program from the external diagnostic system;
   a programmable loading circuit for altering an electrical load of one of more of the memory module interface terminals, whereby the behavior of the memory subsystem is altered;
   a circuit for manipulating a signal on at least one of the memory module interface terminals in an analog domain to simulate noise, wherein the interface receives a command to manipulate the signal, and wherein the circuit manipulates the signal in response to receiving the command;
   an output driver having a programmable drive strength, wherein the interface receives a command to alter a drive strength of an output signal provided from the diagnostic memory module on at least one of the memory module interface terminals, and wherein the processing unit sets the programmable drive strength of the output driver in response to receiving the command;
   a timing offset circuit for adjusting a timing relationship between address signals and data signals within the diagnostic memory module, and wherein the interface receives a command to adjust the timing relationship between the address signals and the data signals, and wherein the processing unit programs the timing offset circuit to adjust the timing relationship in response to receiving the command; and
   at least one test point for probing signals within the diagnostic memory module.

* * * * *